United States Patent [19]

Shintani et al.

[11] Patent Number: 5,814,149

[45] Date of Patent: Sep. 29, 1998

[54] METHODS FOR MANUFACTURING MONOCRYSTALLINE DIAMOND FILMS

[75] Inventors: Yoshihiro Shintani, Tokushima; Takeshi Tachibana, Hyogo; Kozo Nishimura, Hyogo; Koichi Miyata, Hyogo; Yoshihiro Yokota, Hyogo; Koji Kobashi, Hyogo, all of Japan

[73] Assignee: Kabushiki Kaisha Kobe Seiko Sho, Kobe, Japan

[21] Appl. No.: 560,077

[22] Filed: Nov. 17, 1995

[30] Foreign Application Priority Data

Nov. 25, 1994 [JP] Japan ................................... 6-315975

[51] Int. Cl.⁶ .................................................. C30B 29/04
[52] U.S. Cl. ....................... 117/104; 117/108; 117/929; 423/446
[58] Field of Search ...................... 117/104, 108, 117/929; 423/446

[56] References Cited

U.S. PATENT DOCUMENTS

| 5,298,286 | 3/1994 | Yang et al. ............................. 117/929 |
| 5,404,835 | 4/1995 | Yoder ..................................... 117/929 |

FOREIGN PATENT DOCUMENTS

| 386726 | 9/1990 | European Pat. Off. ............... 117/929 |
| 0 492159 | 7/1992 | European Pat. Off. . |
| 0 534729 | 3/1993 | European Pat. Off. . |
| 0 598361 | 5/1994 | European Pat. Off. . |
| 0 636706 | 2/1995 | European Pat. Off. . |
| 61-286299 | 12/1986 | Japan ..................................... 117/929 |
| 3274001 | 12/1991 | Japan . |

OTHER PUBLICATIONS

Database WPI, Derwent Publications, AN–94–283741/35, JP–6–212428, Aug. 2, 1994.

Primary Examiner—Robert Kunemund
Attorney, Agent, or Firm—Oblon, Spivak, McClelland, Maier & Neustadt, P.C.

[57] ABSTRACT

A method is related to grow monocrystalline diamond films by chemical vapor deposition on large area at low cost. The substrate materials are either bulk single crystals of Pt or its alloys, or thin films of those materials deposited on suitable supporting materials. The surfaces of those substrates must be either (111) or (001), or must have domain structures consisting of (111) or (001) crystal surfaces. Those surfaces can be inclined within ±10 degree angles from (111) or (001). In order to increase the nucleation density of diamond, the substrate surface can be scratched by buff and/or ultrasonic polishing, or carbon implanted. Monocrystalline diamond films can be grown even though the substrate surfaces have been roughened. Plasma cleaning of substrate surfaces and annealing of Pt or its alloy films are effective in growing high quality monocrystalline diamond films.

30 Claims, 9 Drawing Sheets

F I G. 3a
F I G. 3b
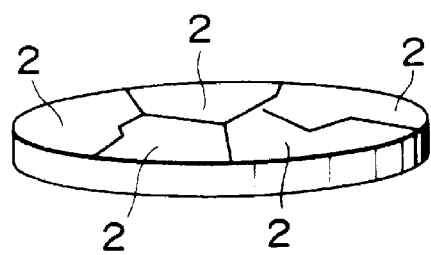
F I G. 3c
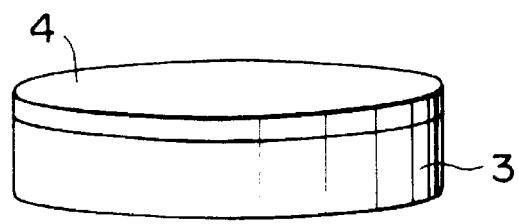
F I G. 3d
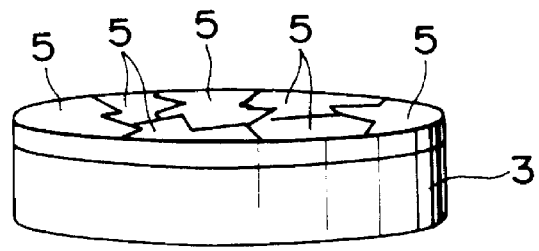

F I G. 6
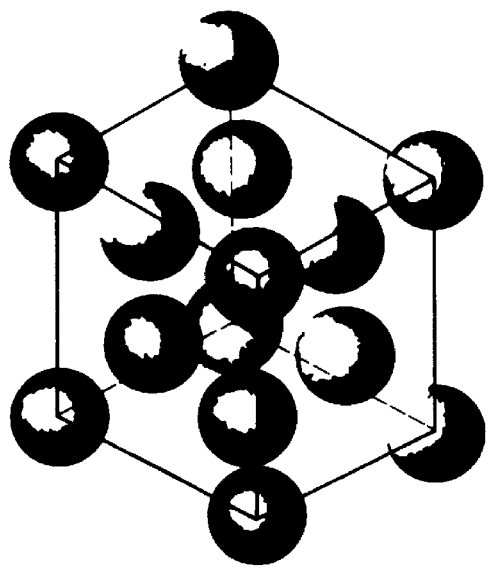
F I G. 7
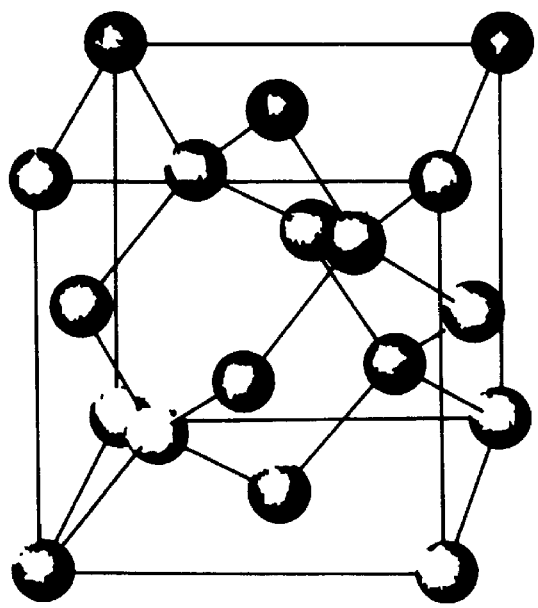

METHODS FOR MANUFACTURING MONOCRYSTALLINE DIAMOND FILMS

BACKGROUND OF THE INVENTION

1. Field of the Invention:

The present invention is related to a novel method of manufacturing monocrystalline diamond films by chemical vapor deposition (CVD). The diamond films made according to the present invention can be used for electronic devices and sensors, such as transistors and diodes, heat sinks, surface acoustic wave devices, X-ray windows, optical materials, antiwear materials, decorating materials, all including coatings.

2. Description of the Related Art:

Diamond is known to be excellently resistant to high temperature. It has a large band gap (5.5 eV), and hence is electrically a good insulator in its undoped state. However, it can be semiconducting by doping suitable impurity atoms in it. Furthermore, diamond has excellent electrical properties such that the breakdown voltage is high, the saturation velocities of carriers (electrons and holes) are also high, and the dielectric constant, and hence the dielectric loss, is small. These characteristics are most suitable for diamond applications to electronic sensors and devices operational at high temperature, high frequency, and high electric field.

Diamond is also expected to be used for various applications, e.g., optical sensors and light emission devices in the short wavelength region based on diamond's large band gap; heat sinks based on its high thermal conductivity and small specific heat, surface acoustic wave devices based on its extreme hardness (diamond is the hardest among all materials); and X-ray windows and optical materials based on its high tansmission and low refractive index over a wide range of wavelength from infrared to near ultraviolet. Moreover, diamond is used as antiwear parts of many kinds of cutting tools.

In order to fully utilize the excellent characteristics of diamond for those applications, it is most important to synthesize high quality monocrystalline diamond films in which structural defects are minimized. Futhermore, low cost production of monocrystalline diamond films on large area is necessary for its practical use. As is very well known, bulk diamond crystals are presently produced either by mining natural diamond or by artificially synthesizing bulk crystals under high pressure-high temperature conditions. However, the areas of crystal facets for those diamonds are only about 1 $cm^2$ at best, and such diamond is extremely expensive. Therefore, industrial applications of diamond today are limited only to specific fields, such as abrasive powders and high precision cutting tool tips, where only small size diamond is sufficient.

Regarding CVD of diamond films, the following techniques are known: microwave plasma CVD (for example, see Japanese Patents Publication Nos. Hei 59-27754 and Hei 61-3320), radio-frequency plasma CVD, hot filament CVD, direct-current plasma CVD, plasma-jet CVD, combustion CVD, and thermal CVD. By those techniques, it is possible to form continuous diamond films over large area. However, the diamond films grown by those methods on non-diamond substrates such as silicon are polycrystalline as seen in FIG. 1, where diamond grains are coalesced in a random fashion, and therefore numerous grain boundaries exist in the film. Techniques to synthesize highly oriented diamond films as shown in FIG. 2 are known, but they also are polycrystalline, including a high density of grain boundaries in the film.

Because of such grain boundaries, neither polycrystalline nor highly oriented diamond films are able to achieve electrical characteristics that are originally owned by bulk diamond crystals, which are free of grain boundaries, as carriers for electrical conduction are trapped or scattered at the grain boundaries in the polycrystalline films. Therefore, the performance of electronic sensors and devices made of either polycrystalline or highly oriented diamond films is far inferior to that made of bulk single crystal diamond.

In optical applications, polycrystalline diamond has a lower optical transmittance than bulk diamond crystals because of light absorption and scattering at the grain boundaries. Likewise, in antiwear applications using polycrystalline diamond films, chipping occurs more easily at the grain boundaries than in bulk diamond.

It is known that monocrystalline diamond films can be grown by CVD on bulk diamond and cubic boron nitride single crystals. Unfortunately, large crystal facets are not available for both materials, and thus it is not possible to deposit large-area monocrystalline diamond films on those substrates.

It is also known that diamond grains grown on nickel (Ni) or copper (Cu) substrates by CVD are oriented to a certain degree. However, in the former case, there are problems in that the Ni substrate becomes fragile and deteriorated under CVD conditions for diamond growth, where Ni is in contact with a high temperature hydrogen plasma. Furthermore, Ni reacts with deposited diamond to convert it to graphite [D. N. Belton and S. J. Schmeig, J. Appl. Phys., Vol. 66, p. 4223 (1989)]. On the other hand, for the latter case, the deposited diamond film is peeled off the Cu substrate after the specimen is pulled out of the CVD reactor due to the stress between the diamond film and the Cu substrate generated by the difference between the temperature during CVD (higher than 600° C.) and room temperature, and the difference in the thermal expansion coefficients between diamond and Cu. The linear thermal expansion coefficient of Cu is about ten times greater than that of diamond [J. F. Denatale et al., J. Mater. Sci., Vol. 27, p. 553 (1992)].

Diamond CVD on platinum (Pt) and other transition metals has been attempted already, but it was only polycrystalline diamond films or diamond particles that have resulted, and monocrystalline diamond films have not been obtained [Sakamoto and Takaya, Hyomen Gijutsu, Vol. 44, No. 10, p. 47 (1993); M. Kawarada et al., Diamond and Related Materials, Vol. 2, p. 1083 (1993); D. N. Belton and S. J. Schmeig, J. Appl. Phys., Vol. 69, No. 5, p. 3032 (1991); D. N. Belton and S. J. Schmeig, Surface Sci., Vol. 233, p. 131 (1990); Y. G. Ralchenko et al., Diamond and Related Materials, Vol.2, p. 904 (1993)].

For practical use of diamond films in industry, particularly for electronics and optics, it is necessary to achieve growth of monocrystalline diamond films that are either completely free of grain boundaries or include sufficiently low density of grain boundaries on large area at low cost. Unfortunately, such technology has not been found yet.

SUMMARY OF THE INVENTION

It is an object of the present invention to provide a novel method for manufacturing monocrystalline diamond films by CVD on large area at low cost.

It is another object of the invention to provide a method for manufacturing monocrystalline diamond films that have markedly improved quality and characteristics, and hence can be used in a number of fields in industry.

The present invention is based on a discovery by the present inventors that monocrystalline diamond films with (111) and (001) surfaces are grown by CVD on (111) and (001) surfaces, respectively, of Pt and Pt alloys. It was also discovered that monocrystalline diamond films can also be grown even though the (111) and (001) surfaces of Pt or its alloys are inclined within ±10 degree angles from (111) and (001), respectively.

In what follows, for the sake of simplicity, an expression, "(111) crystal surfaces of Pt or its alloys," will be often used to represent not only (111) crystal surfaces of Pt or its alloys but also all Pt and its alloy crystal surfaces with angular deviations within ±10 degrees from (111). The same will apply for (001). Moreover, descriptions will often be given only for Pt for the sake of simplicity, when the extension to Pt alloys is obvious.

The substrates to be used for the growth of monocrystalline diamond films can be bulk Pt or its alloys with the above defined crystal surfaces. Alternatively, they can be films of Pt or its alloys deposited on suitable supporting materials as long as the films have the above defined crystal surfaces.

The Pt alloys preferably comprise at least one element selected from Group VIA of the Periodic Table such as Cr, Mo, and W, Group VIIA such as Mn, Group VIIIA such as Fe, Co, Ir, Ni, and Pd, and Group IB such as Au, Ag, and Cu.

The supporting materials for the films of Pt and Pt alloys can be single crystals of lithium fluoride, calcium fluoride, magnesium oxide, nickel oxide, zirconium oxide, sapphire (aluminum oxide), strontium titanate, barium titanate, lead titanate, potassium tantalate, and lithium niobate. Alternatively, the support materials can be single crystal silicon, quartz, and glasses, as long as the Pt or Pt alloy films possess the (111) or (001) crystal surfaces. The Pt or Pt alloy films can be deposited either on the entire surfaces of the supporting materials or at least on their selected areas.

BRIEF DESCRIPTION OF THE DRAWINGS

FIGS. 3(a) to 3(d) illustrate different types of the substrates used in the present invention;

FIG. 6 schematically shows the crystal structure of Pt, known as the face-centered-cubic (fcc) structure;

FIG. 7 schematically shows the crystal structure of diamond, known as the diamond structure;

DESCRIPTION OF THE INVENTION AND PREFERRED EMBODIMENTS

Figure 1:
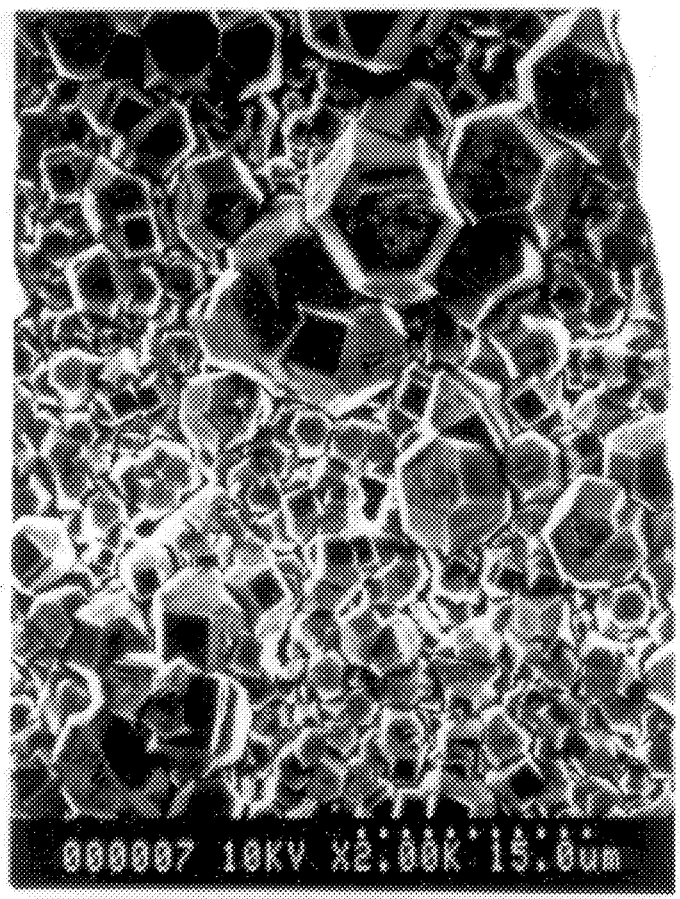
FIG. 1 is a photograph by secondary electron microscopy (SEM) of a polycrystalline diamond film, where diamond grains are randomly oriented.
Figure 2:
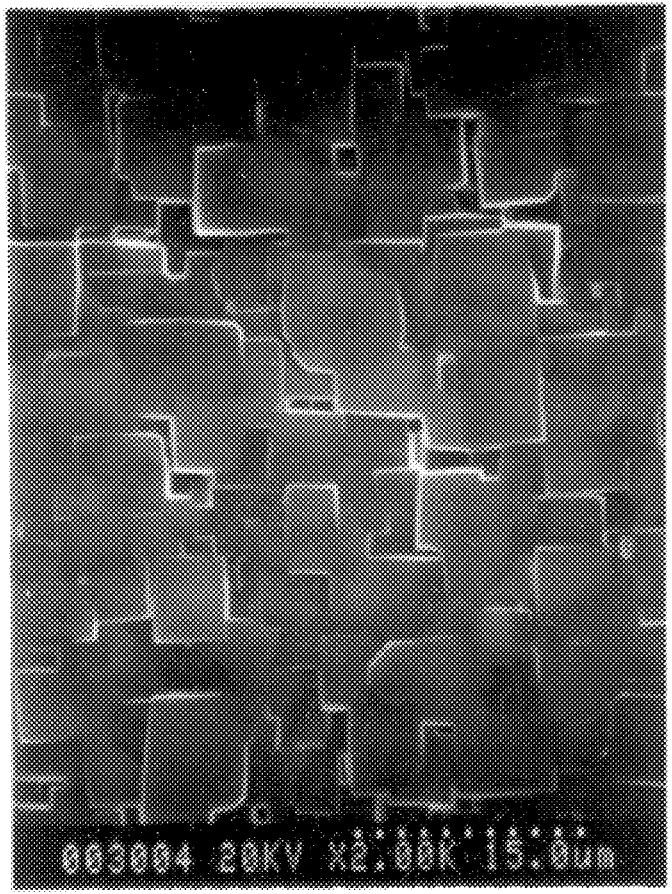
FIG. 2 is a SEM photograph of a highly oriented diamond film, where square (001) facets of diamond grains are regularly oriented in the same direction. However, microscopic analyses have revealed that there are misorientations of one to five degree angles between adjacent diamond grains.
Figure 4:
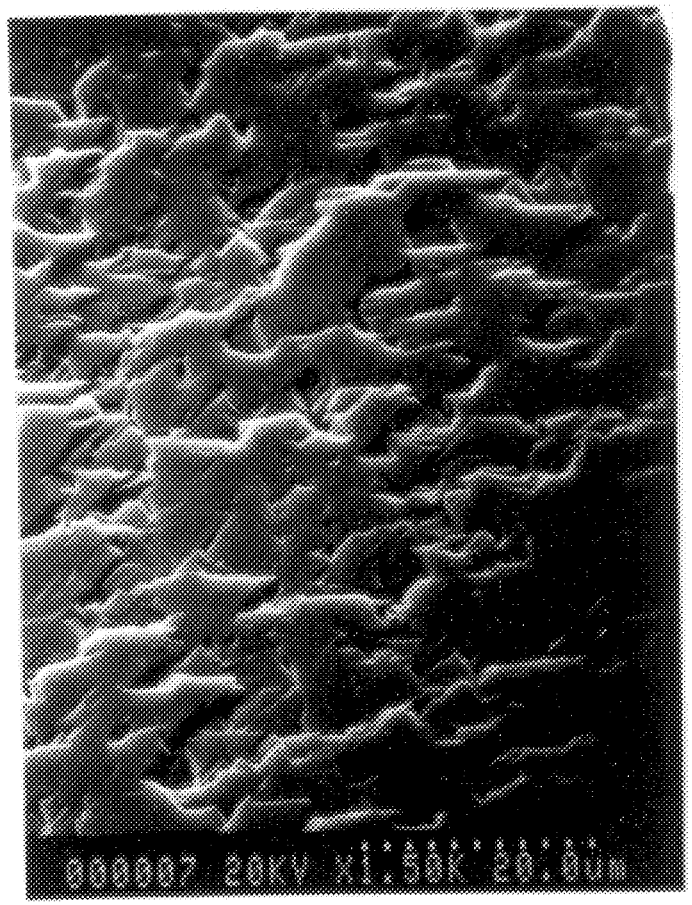
FIG. 4 is a SEM photograph of a monocrystalline diamond film grown according to the present invention, where (111) facets of diamond are being coalesced. This photograph is taken from the direction normal to the film surface.
Figure 5:
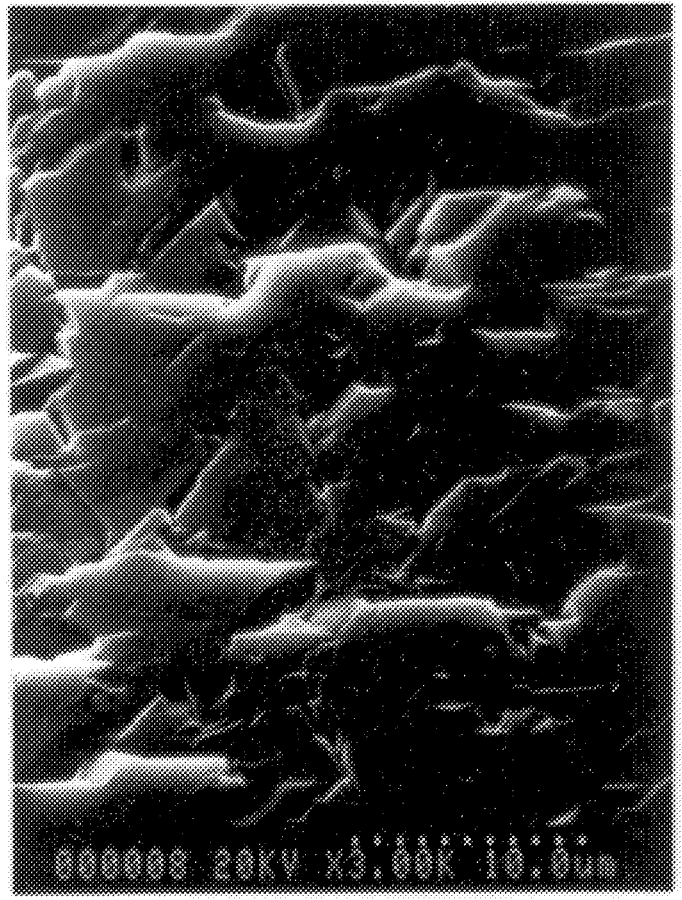
FIG. 5 is a SEM photograph of the same monocrystalline diamond film as that shown in FIG. 4. This photograph is taken from the direction inclined from the surface normal.

The present invention is based on an unexpected discovery by the present inventors that monocrystalline diamond films with (111) and (001) surfaces are formed by CVD on (111) and (001) surfaces of Pt or its alloys, respectively. SEM photographs of the result of (111) are shown in FIGS. 4 and 5.

In this discovery, there are a number of issues that are difficult to understand by the existing theories of heteroepitaxial growth, i.e. growth of monocrystalline diamond films on non-diamond substrates. The first is the fact that the lattice constant of Pt (3.9231 Å) differs as much as about 10% from that of diamond (3.566 Å). It has been generally considered that growth of single crystal film is not possible in such a case that there is a large difference in lattice constants between the substrate material and the material to be deposited, as in the case of the present invention. The second is the fact that the crystal structure of Pt is fcc (see FIG. 6), which is different from the diamond structure (see FIG. 7), and thus the Pt substrate and the deposited diamond film cannot be structurally continuous. For those reasons, growth of monocrystalline diamond films on such a substrate as Pt has been no better than a speculation. In fact, only randomly oriented, polycrystalline diamond films have been obtained by CVD on Pt foils.

By contrast, it was discovered by the present inventors that monocrystalline diamond films can be grown by CVD not only on Pt but also on Pt alloys, if (111) or (001) crystal surfaces are exposed at the surfaces of the Pt or Pt alloy substrates.

It was also discovered in the present invention that nucleation of diamond on Pt or Pt alloy substrates at high density is possible by applying bias voltage to the substrate in a plasma atmosphere that includes carbon at the beginning of diamond CVD. This method is called "bias-enhanced nucleation (BEN)."

Alternatively, the substrate surface can be scratched with diamond powder or diamond paste by buff and/or ultrasonic polishing prior to CVD of diamond. It has been generally understood that the substrate surface must be atomically smooth for heteroepitaxial growth. This traditional concept is in strong contrast to the present experimental discovery, because in the present invention, the (111) or (001) crystal surfaces of Pt or Pt alloys can be roughened considerably by the polishing, and yet monocrystalline diamond films can be grown on such substrates. Namely, the present invention teaches that monocrystalline diamond films can be grown by CVD even on such roughened substrates. Such a fact is impossible to be predicted by the existing theories.

The present inventors have tested carbon (C)-ion implantation as a substrate pretreatment using the following conditions: the acceleration voltage was 40–120 keV, and the C implantation density was $10^{16}$–$10^{20}$ cm$^{-2}$. It was concluded from the test that the diamond nucleation density can be significantly increased by the C-ion implantation to the substrate.

The mechanism of diamond formation on (111) or (001) crystal surfaces of Pt and its alloys is not known but inferred as follows: since Pt is known to have catalytic actions, molecules adsorbed to its surface are easily decomposed. Therefore, the density of chemically active carbon species is assumed to be high at the substrate surface during CVD. Such carbon species may diffuse into the interior of the substrate. As a result, the Pt surface, and the surface layer as well, is supersaturated with carbon atoms, which then crystallize to be diamond nuclei. Along with the formation of diamond nuclei, non-diamond structures of carbon such as graphite can also be produced, but it is known that they are readily etched by reactions with chemically active hydrogen and oxygen in the plasma of the source gas during CVD. If it is carbon atoms dissolved in the substrate that form diamond nuclei, the orientation of the individual diamond nucleus is determined solely by the (111) or (001) structure inside the substrate. Therefore, the surface roughness due to the mechanical polishing gives little effect on the orientation of diamond nuclei. Rather, the surface roughness has an effect of accelerating diffusion of carbon atoms inside the substrate.

The use of Pt or its alloys for the substrate material has the following grounds: the catalytic action of Ni is so strong that diamond once formed is converted to graphite. On the other hand, the catalytic action of Cu is too weak, and the carbon density inside the Cu substrate cannot be sufficiently high for diamond nucleation, as Cu does not have a strong affinity with carbon. Silicon (Si), which is most often used as substrates for CVD of diamond, forms a strong covalent bond with carbon, so that spontaneous diamond nucleation is suppressed. By contrast, although Pt has catalytic actions, they are not excessively strong unlike Ni, and Pt allows carbon atoms to dissolve and nucleate in it. Moreover, the chemical affinity of Pt with carbon is moderate. Accordingly, Pt or its alloys seem to possess the most suitable conditions as the substrate for diamond film heteroepitaxy by CVD.

In case that the substrates, manufactured according to the present invention, comprise of the films of Pt or its alloys deposited on suitable substrates, there is in principle no limitation in the area of monocrystalline diamond films, and thus a large area deposition of monocrystalline diamond films is possible.

It is apparent that the effects described above mostly on Pt are also applicable to Pt alloys. In this case, the minority components of the Pt alloys can include the VIA elements such as Cr, Mo, and W, the VIIA elements such as Fe, Co, Ir, Ni, and Pd, and the IB elements such as Au, Ag, and Cu. It is known that the VIA and VIIA elements form stable carbides, the VIIIA elements react strongly with carbon, and the IB elements are inactive with carbon. Therefore, by using Pt alloys that contain those elements, it is possible to control the catalytic action of Pt alloys, and add new chemical reactivity to them. Moreover, a fine tuning of the lattice constant is possible by alloying, and hence the orientation of the deposited diamond film can also be controlled. These are the major advantages of using Pt alloys as the substrates for the deposition of monocrystalline diamond films.

According to a study by the inventors, those elements in the Pt alloys should not exceed 50%, otherwise the catalytic and other effects of Pt are too weakened.

Platinum or its alloys can be deposited by known methods including sputtering and electron beam deposition. There is no restriction on the film thickness. However, if the films are too thin, they may be peeled off the supporting material during or after CVD. On the other hand, a longer deposition time is required for depositing thick films of Pt or Pt alloys. Therefore, it is preferable at the present stage to make the film thickness of Pt or its alloys to be more than about 1000 Å and less than about 0.5 mm.

Among various deposition methods, sputtering is most convenient and simple to form single crystal films of Pt or its alloys. For CVD of diamond films, any of the previously mentioned methods can be used. However, microwave plasma CVD is preferable and most convenient to carry out substrate pretreatments and CVD of diamond films successively.

In CVD of diamond, it is known that (111) and (001) crystal surfaces of diamond appear most often under standard CVD conditions, and other crystal surfaces are very unlikely to appear. Therefore, the substrate surfaces of Pt and Pt alloys also should be either (111) or (001), because monocrystalline diamond films with (111) or (001) crystal surfaces can grow on (111) or (001) crystal surfaces of Pt or its alloys, respectively.

FIGS. 3(a) and 3(b) illustrate examples of such substrate structures. FIG. 3(a) is the case of the single crystal substrate 1 of Pt or its alloys. The surface of the substrate is (111). FIG. 3(b) is the case of domain structure composed of plural single crystals 2 with (111) surfaces. The azimuthal orientations of the domains 2 are different from each other.

In order to make a uniform monocrystalline diamond film, the entire surface of Pt or its alloys must be (111) or (001), as shown in FIG. 3(a). However, even if the surface consists of the domains of either (111) or (001), as shown in FIG. 3(b), with each area being preferably larger than 2500 square microns (1 micron=$10^{-6}$ m), and their azimuthal angles being different from each other, a monocrystalline diamond film with (111) or (001) crystal surface can grow on each of the domains. Although such a diamond film has a domain structure, its characteristics are substantially the same as those of bulk diamond as each of the domains of the diamond film is sufficiently large.

Regarding the crystal surfaces of Pt and its alloys, it is preferable to be exactly (111) or (001). However, monocrystalline diamond films can also be grown on off-axis crystal surfaces, if the angular deviation is within ±10° from (111) or (001), because the difference of the inclined (111) surface from the exact (111) surface is only the existence of atomic-scale step structures in the former case. In case that the deviation is beyond ±10°, monocrystalline diamond films are not grown, because the desired crystal surfaces do not appear.

The (111) and (001) crystal surfaces of Pt or its alloys can be formed by depositing the films of Pt or its alloys on (111) and (001) crystal surfaces of the following supporting materials, respectively: lithium fluoride, calcium fluoride, magnesium oxide, nickel oxide, zirconium oxide, sapphire (aluminum oxide), strontium titanate, barium titanate, lead titanate, potassium tantalate, and lithium niobate. In those cases, the films of Pt or its alloys can be deposited either on the entire surfaces of the supporting materials or at least on their selected areas, depending on the purposes of applications.

Alternatively, the supporting materials may be single crystal silicon, quartz, and glasses, as long as the deposited films of Pt or Pt alloys possess (111) or (001) crystal surfaces. To this end, the surfaces of those materials may have to be modified by known techniques, or thin films of different materials must be deposited on those materials prior to CVD of diamond, instead of using bare materials. For the case of Pt or Pt alloy films described so far, the cost of the substrate is significantly lower than bulk Pt or its alloys. The present invention does not exclude such possibilities.

Usually, the films of Pt or its alloys deposited by sputtering or electron beam deposition on the above described supporting materials are not single crystals, and hence exact (111) or (001) crystal surfaces do not appear at the film surfaces. In order to cope with the problem, the films should be annealed at a temperature above 300° C. in situ (during the deposition) or post deposition. The optimum annealing time depends on the annealing temperature and the thickness of the film. A study by the present inventors indicates that annealing above 800° C. is preferable. The annealing is usually undertaken in vacuum.

According to the studies by the present inventors, however, annealing in an oxidation atmosphere facilitates the growth of monocrystalline diamond films in CVD, presumably because of some effects of oxygen adsorbed during the annealing. By contrast, annealing in a reduction environment, such as in hydrogen gas over an extended period of time, is not recommended, because Pt and its alloys are deteriorated in such an environment.

As mentioned before, continuous monocrystalline diamond films are grown on Pt or Pt alloy substrates, even though the substrate surfaces have been roughened by scratching using buff and/or ultrasonic polishing with diamond powder or diamond paste prior to diamond CVD. This is because the orientations of diamond nuclei are determined by the (111) or (001) crystal structure inside the Pt or Pt alloy substrate, as carbon atoms are dissolved into the substrate bulk. Therefore, the roughening of the substrate surfaces gives little effect on the orientation of diamond nuclei. The roughened surfaces rather facilitate carbon atoms to diffuse into the substrate interior. This is an unexpected and still unexplained phenomenon discovered by the present inventors.

Usually, various molecular and atomic species such as nitrogen, oxygen, water and the like in air are physically or chemically adsorbed on the substrate surface. If diamond CVD is done on substrates of Pt or its alloys with the presence of such adsorbed species, orientations of diamond particles become random and a high density of defects is produced in diamond, thereby preventing formation of monocrystalline diamond films. To solve the problem, the substrates with a deposited film of Pt or its alloy is rinsed in appropriate liquids, such as aqua regia or organic solvents, followed by drying it in vacuum better than $10^{-6}$ Torr (1 Torr=133 Pa) above 300° C. for more than 15 minutes in order to desorb the species, and then treated with a plasma that contains at least one gas selected from hydrogen, oxygen, chlorine and fluorine, or at least one gas selected from helium, neon and argon, or both. In this way, the substrate surface can be cleaned.

In order to facilitate diamond nucleation, the substrate surface must be treated by a carbon-containing plasma to create a supersaturation of carbon at the substrate surface. In this treatment, it is likely to happen that non-diamond carbon components such as amorphous carbon and amorphous graphite are deposited on the substrate surface together with diamond nuclei. Since these substances have no orientational relationship with the substrate structure, they impede formation of monocrystalline diamond films. Such carbon substances can be removed by adding at least one gas selected from hydrogen, oxygen, chlorine and fluorine, or at least one gas selected from helium, neon and argon, or both, in the carbon-containing gas.

For diamond growth, known CVD methods, such as microwave plasma CVD, radio frequency plasma CVD, hot filament CVD, DC plasma CVD methods, plasma jet, combustion, thermal CVD and the like can be used.

At the early stage of diamond CVD, diamond nucleation occurs only after the substrate surface is supersaturated with carbon. However, diamond nuclei are likely to be totally damaged by collisions of high energy ions from the plasma. Therefore, it is necessary to form diamond nuclei on the substrate and grow them up to bigger diamond crystallites as soon as diamond CVD begins. To this end, the BEN method (electrical biasing of the substrate in the plasma for diamond nucleation) is very effective, because the substrate surface is quickly supersaturated with carbon-containing species as ions containing carbon atoms are attracted to the substrate by the electric field due to the bias, and thus diamond nuclei are more readily formed and grown. The effects of the applied electrical bias are similar for positive or negative biasing. However, negative voltage seems to be preferable.

Monocrystalline diamond films can be grown even without using the BEN method. However, better uniformity of the film thickness and quality, as well as larger areas, of monocrystalline films are achieved when the BEN method is used.

Since Pt is deteriorated by a prolonged exposure to hydrogen at high temperature, it is preferable to undertake either bias-enhanced nucleation of diamond or diamond CVD, or both, using source gases which do not contain hydrogen, for example, carbon monoxide (CO) or a combination of CO and carbon dioxide ($CO_2$). However, at the present stage, usage of the known combinations of gases, such as hydrocarbon, hydrogen, and oxygen as the source gas, is more advantageous than that of CO in view of safety and cost.

If a hydrogen-containing gas is used for diamond nucleation using the BEN method, it is preferable that a carbon-containing gas diluted with hydrogen to 0.1–10% be used under the conditions that the gas pressure is 1–100 Torr, the substrate temperature is 400°–1100° C., and a DC voltage −70 to −350 V or +70 to +350 V is applied to the substrate for 1 to 90 minutes.

In those conditions, if the hydrocarbon concentration is not greater than 0.1 vol %, the substrate surface is not supersaturated with carbon, and thus diamond nucleation does not occur. On the other hand, if it is not less than 10 vol %, non-diamond carbon substrates are likely to be deposited, and monocrystalline diamond films no longer grow. If the gas pressure is not higher than 1 Torr, the carbon concentration at the substrate surface does not reach the supersaturation state. The biasing is no longer effective if the gas pressure is not lower than 100 Torr. The substrate temperature range between 400° and 1100° C. is known to be most relevant for diamond growth. If the absolute value of the bias voltage is smaller than 70 V, no biasing effect is seen, while if it is over 350 V, diamond nuclei are severely ion-damaged, and thus the crystallinity of diamond is significantly lowered. The biasing time should not be shorter than 1 minute to make the biasing effective, but a biasing over 90 minutes results in damage on diamond nuclei.

In the CVD of diamond on Pt or its alloys, the catalytic action of Pt gives a strong influence on the CVD of diamond, unlike silicon, which is most often used as substrates for CVD. In order to identify the optimum growth conditions for diamond growth, the present inventors repeated a number of experiments, and found that (111) crystal facets of diamond are dominant at diamond film surfaces when CVD is undertaken under the following CVD conditions on Pt or Pt alloy substrates with (111) crystal surfaces: for the source gas, a mixture of methane ($CH_4$) diluted by hydrogen and oxygen ($O_2$) is used, where the $CH_4$ and $O_2$ concentrations in the source gas, denoted as $[CH_4]$ and $[O_2]$, respectively, are $0.1\% \leq [CH_4] \leq 5\%$ and $0.1\% \leq [O_2] \leq 3\%$, respectively, and the substrate temperature is above 750° C.

On the other hand, it was found that (001) crystal facets of diamond are dominant at diamond film surfaces when CVD is undertaken under the following CVD conditions on Pt or Pt alloy substrates with (001) crystal surfaces: for the source gas, a mixture of methane ($CH_4$) diluted by hydrogen and oxygen ($O_2$) is used, where the $CH_4$ and $O_2$ concentrations in the source gas are $5\% \leq [CH_4] \leq 15\%$ and $1\% \leq [O_2] \leq 7\%$, respectively, and the substrate temperature is below 850° C.

Growth of high quality monocrystalline diamond films is achieved by adding inert gases, such as helium, neon, argon and the like, to the source gas as these gases are easily ionized to be ions and hence activate the plasma. Likewise, growth of high quality diamond films with a good epitaxial relationship to the substrate structure is achieved when halogen-containing gases, such as carbon tetrachloride ($CCl_4$), chloroform ($CHCl_3$), dichloromethane ($CH_2Cl_2$), chloromethane ($CH_3Cl$), carbon tetrafluoride ($CF_4$) and the like, are added to the source gas, because the halogen atoms produced by the decomposition of those gases in the plasma preferentially etch unstable nuclei not epitaxial to the substrate.

Platinum and its alloys are expensive, but their usage as the substrates for CVD will not lead to increased cost in the production of monocrystalline diamond films, because they are easily detached from diamond films after CVD. Using metal substrates is rather advantageous, because they can be used as electrodes for diamond film applications for electronic sensors and devices.

In case that the deposited monocrystalline diamond films are used for optical windows and heat sinks, no substrates are needed. In such cases, the substrate materials can be mechanically or chemically removed. Furthermore, polishing of one or both sides of the free-standing diamond films is possible for those applications.

The thickness of monocrystalline diamond films depends only on the duration time of CVD. Generally, it can be between 0.1 microns and 1 mm. It is also possible to form monocrystalline diamond films on substrates by microwave plasma CVD, which is then followed by plasma jet or combustion CVD to make the film significantly thicker.

Semiconducting monocrystalline diamond films of p- and n-type can be deposited by introducing boron (B)-containing gas (such as $B_2H_6$) and phosphorus-containing gas (such as $PH_3$), respectively, in the source gas during CVD.

In the present invention, it is easy to grow monocrystalline diamond films in selected areas of the substrate. This is achieved by masking unnecessary areas with silicon nitride or silicon oxide films prior to diamond CVD.

EXAMPLES

The present invention is more particularly described by way of the following examples.

Example 1: growth on (111) single crystal Pt

Figure 8:
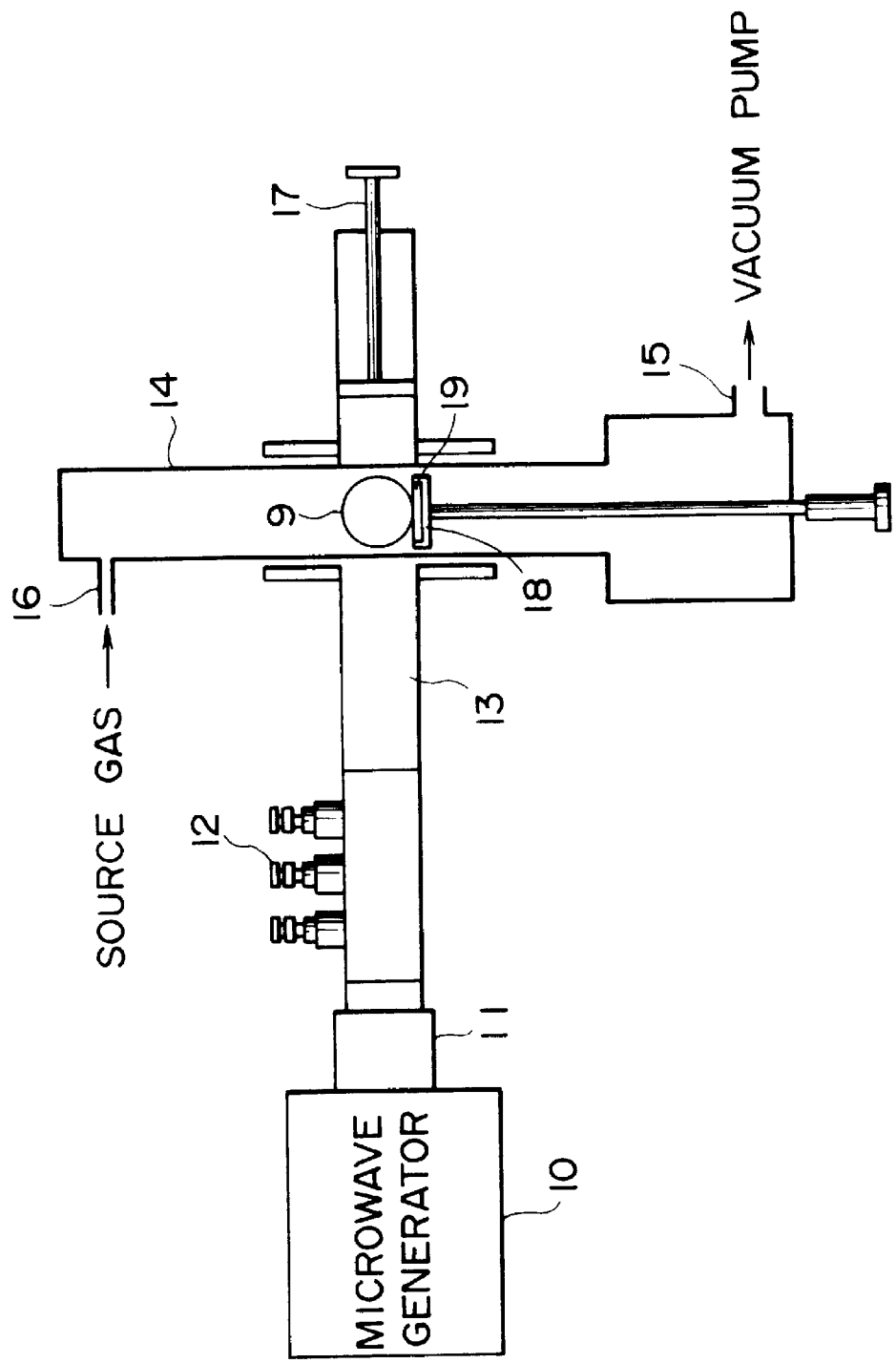
FIG. 8 is a schematic diagram of a standard microwave plasma CVD reactor.

FIG. 8 schematically shows a microwave plasma CVD apparatus used. Microwave was generated in the system consisting of a microwave generator 10, an isolator 11, a tuner 12, and guided toward a plunger 17 through a wave guide 13. A quartz tube 14 was penetrating perpendicularly the wave guide 13. There was a gas inlet port 16 at the upper part of the quartz tube 14, and a gas outlet port 15, leading to a vacuum pump, at the lower part of the quartz tube 14. A substrate holder 18 was placed at the center of the intersection between the quartz tube 14 and the wave guide 13 inside the quartz tube 14. A substrate 19 for diamond deposition was placed on the substrate holder 18. Note that the position of the substrate holder 18 was set by a positioning mechanism (not shown).

In this example, a monocrystalline diamond film was grown on a single crystal Pt substrate (diameter: 10 mm, thickness: 2 mm, and purity: 99.99%). The surface of the substrate was (111). The Pt substrate was placed on the substrate holder 18, and the reaction chamber, i.e. the quartz tube, was evacuated from the gas outlet 15 by a rotary pump. Subsequently, a methane/hydrogen mixed gas with a methane concentration of 0.2–0.8% was introduced at a rate of 100 standard cubic centimeters per minute (sccm), maintaining the chamber pressure at 30–60 Torr. The microwave from the microwave generator 10 was led to the quartz tube 14 through the wave guide 13 in order to produce a plasma in the chamber 14. The substrate temperature was kept at 800°–890° C. by adjusting the microwave power and the substrate position. The substrate temperature was monitored from a viewing port at the top of the quartz tube 14.

After 4 hours, diamond particles with a (111) orientation, epitaxial to the substrate orientation, were grown on the substrate. After 20 hours, adjacent diamond particles coalesced with each other, and a continuous, monocrystalline diamond film was formed on the substrate.

FIGS. 4 and 5 are photographs by secondary electron microscopy (SEM) taken from different angles. It is clearly seen that (111) facets are being coalesced with each other to be a continuous, monocrystalline diamond film.

Example 2: growth on (001) single crystal Pt

In this example, the substrate was the same as in Example 1, but the crystal surface was (001). The growth procedure was also similar to Example 1. The synthesis was carried out for 4 hours using a hydrogen/methane mixed gas with a methane concentration of 0.8 to 7.0%, and a substrate temperature of 700° to 850° C. As a result, diamond particles with the same orientation were grown on the substrate. After 10 hours of CVD, adjacent diamond particles were mutually coalesced to form a monocrystalline diamond film with (001) crystal surface.

Example 3: (111) growth by hot filament CVD

Figure 9:
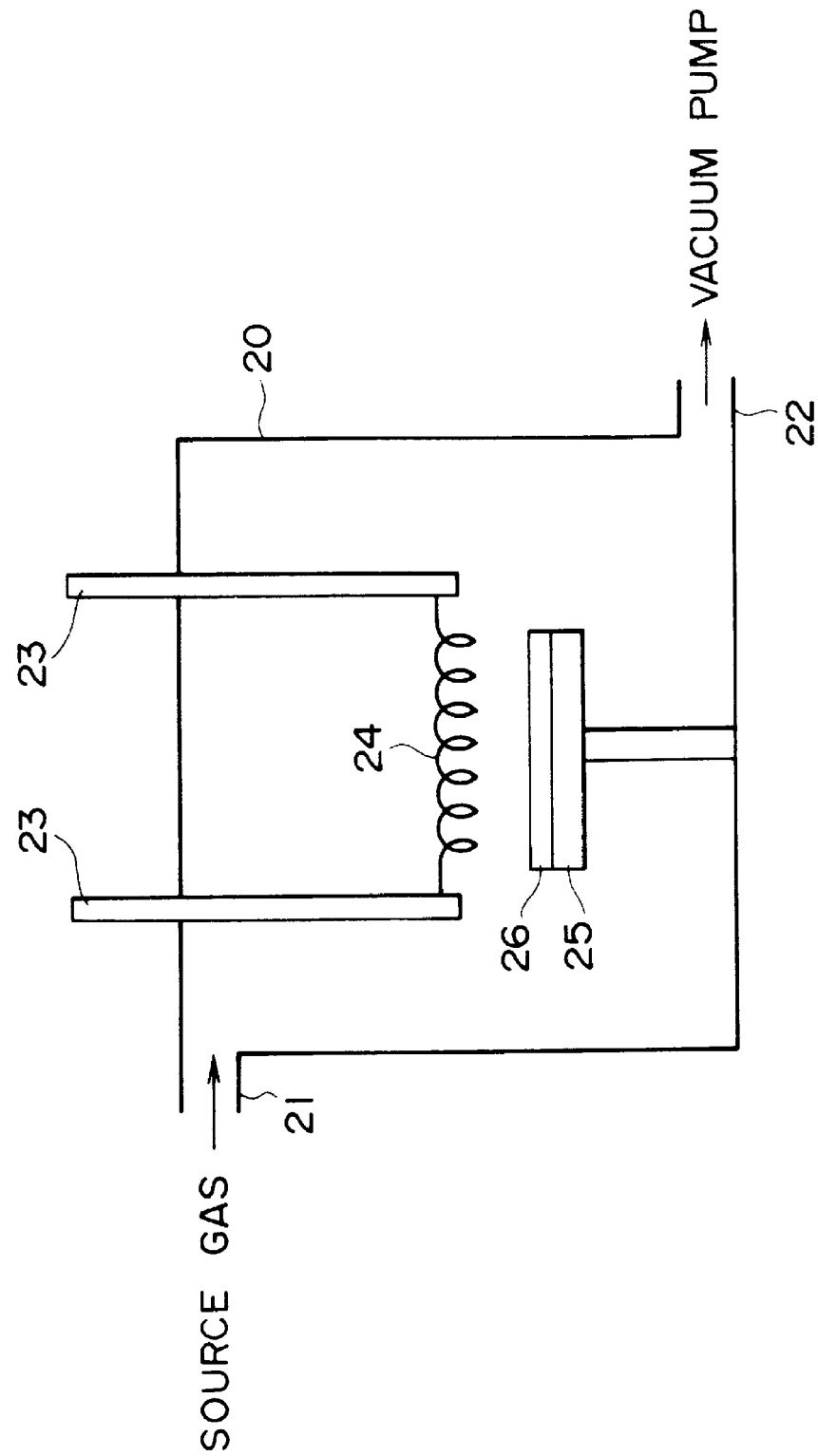
FIG. 9 is a schematic diagram of a hot filament CVD reactor.

A diagram of the hot filament CVD apparatus used is shown in FIG. 9. Inside the vacuum chamber 20, a hot filament 24 is supported by a pair of filament holders 23. A substrate holder 25 is disposed under the filament 24, and a substrate 25 is mounted on the holder 25. The source gas is introduced from a gas inlet 21 and exhausted from a gas exhaust port 22 that is connected to a vacuum pump (not shown). The substrate holder 25 contains a built-in heater (not shown).

A Pt substrate 26, which was the same as in Example 1, was set on the holder 25. The chamber 20 was evacuated through the exhaust port 22 by a rotary pump. Then, a hydrogen/methane mixed gas with a methane concentration of 0.2 to 0.8% was introduced to the chamber at a flow rate of 100 sccm, and the chamber pressure was maintained at a level between 30 and 60 Torr. The hot filament 24 was set 8 mm above the substrate 26 and heated to 2200° C. The power to the substrate heater was adjusted so that the substrate temperature was in a range between 800° and 950° C. This temperature was maintained for 30 to 60 minutes. Subsequently, the substrate temperature was raised to a level between 1300° and 1400° C., and kept for 1 to 5 minutes. Then, the substrate temperature was lowered to a level between 800° and 950° C. to undertake diamond growth. The substrate temperature was measured by an optical thermometer through a viewing port at the top flange of the reactor (not shown). After 4 hours, diamond particles with the same orientation were grown on the substrate. After 10 hours of CVD, adjacent diamond particles were mutually coalesced to form a monocrystalline diamond film with (111) crystal surface.

Example 4: substrate pretreatment by ion implantation

The substrate 26 used was the same as in Example 1. However, in this example, the Pt substrate was pretreated by carbon ion implantation (the acceleration voltage was 60 keV and the carbon concentration was $10^{16}$ $cm^{-2}$). Diamond growth was carried out by the hot filament CVD reactor shown in FIG. 9 under the same conditions as in Example 3. The substrate was set in the CVD reactor that was evacuated to vacuum by a rotary pump. For the source gas, a hydrogen/methane mixed gas with a methane concentration of 0.2 to 0.8% was introduced at a flow rate of 100 sccm while keeping the chamber pressure at 30 to 60 Torr. The hot filament 24 was set at a position 8 mm above the substrate, and was heated to 2200° C. The substrate heater was then controlled so that the substrate temperature was at 800° to 950° C., and the temperature was kept for 30 to 60 minutes. Subsequently, the substrate temperature was increased to 1300° to 1400° C., and maintained for 1 to 5 minutes. Again, the temperature was lowered to a level between 800° and 950° C. The substrate temperature was measured in the same manner as in Example 3. After 4 hours, diamond particles with the same orientation were grown on the substrate. After 20 hours of CVD, adjacent diamond particles were mutually coalesced to form a monocrystalline diamond film with (111) crystal surface.

Example 5: growth by DC plasma CVD

Figure 10:
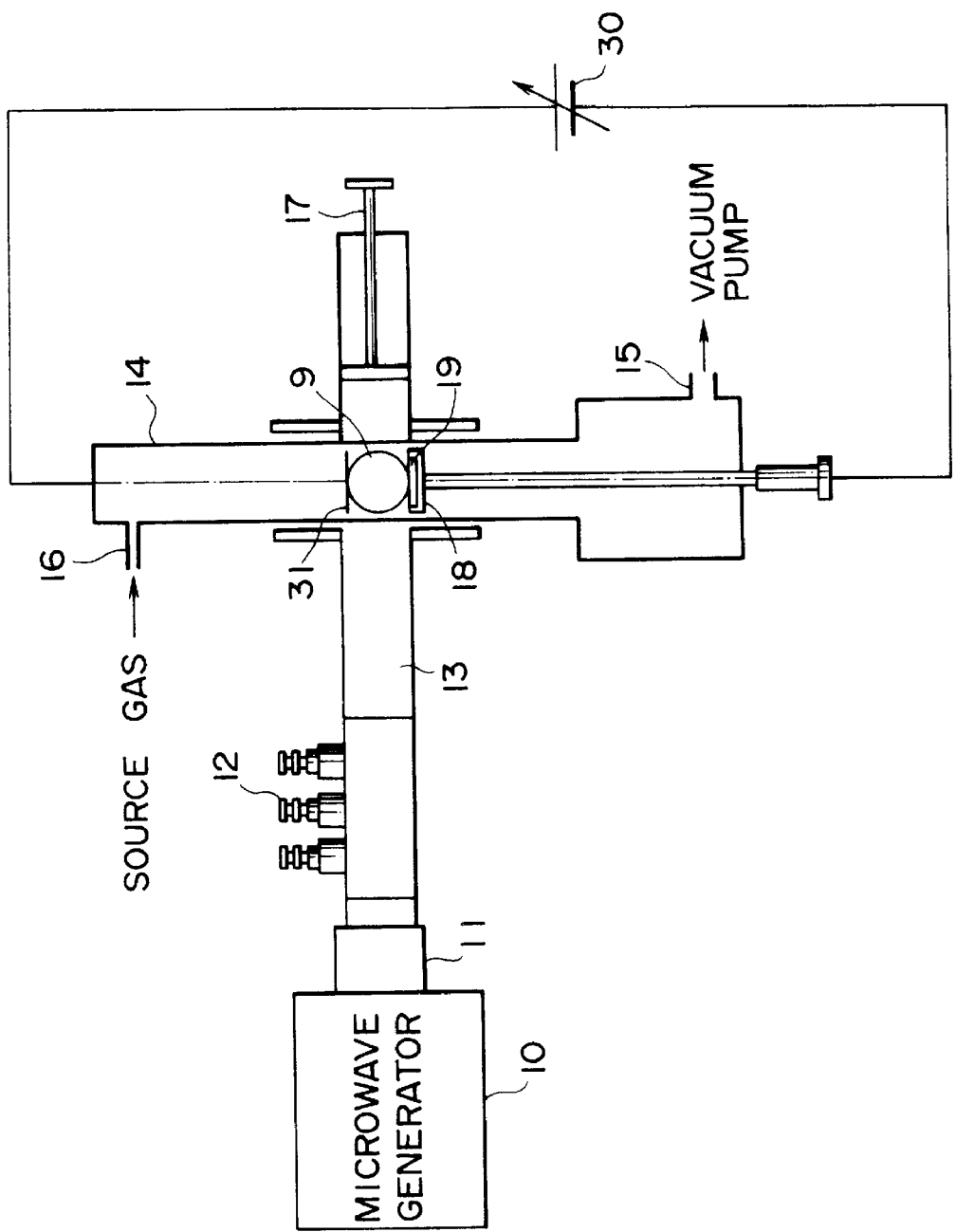
FIG. 10 is a schematic diagram of a microwave plasma CVD reactor, where direct current (DC) voltage can be applied to the substrate.

In this example, the quartz tube microwave plasma CVD reactor described above was modified so that DC voltage can be applied, as shown in FIG. 10. However, this reactor was used for DC plasma CVD and microwave was not turned on. This apparatus differs from that of FIG. 8 in that a counter electrode 31 is provided above the substrate holder 18 within the quartz tube 14. A DC power supply 30 is connected between the counter electrode 31 and the substrate holder 18 so that positive and negative DC voltage can be applied to the counter electrode 31 and the substrate holder, respectively.

A monocrystalline diamond film was synthesized on the Pt (111) substrate described in Example 1. The reactor was first evacuated to vacuum by a rotary pump, and a hydrogen/methane mixed gas with a methane concentration of 1.0% was introduced into the quartz tube 14. Then, a DC plasma was produced by applying a DC voltage between the substrate holder and the counter electrode 31. The gas pressure in the tube 14 was kept at 60 Torr, and the substrate temperature was set at 850° C. After 1 hour, diamond particles with the same orientation were grown on the substrate. After 4 hours of CVD, adjacent diamond particles were mutually coalesced to form a monocrystalline diamond film with (111) crystal surface.

Example 6: growth by combustion CVD

A mixed gas of acetylene and oxygen was passed to a welding gas burner at a rate of 2 liters/minute so that the length of the combustion flame was about 25 cm. A single crystal Pt substrate (purity: 99.99%, diameter: 10 mm and thickness: 1 mm) with a (001) crystal surface was fixed on a water-cooled substrate holder at a position 10 mm below the burner tip, and immersed in the inner flame. The substrate temperature was between 850° and 890° C. After 30 minutes, diamond particles oriented in the same direction were grown on the substrate. After 30 more minutes, under the same experimental conditions, adjacent diamond particles coalesced to form a monocrystalline diamond film with a (001) crystal surface.

Example 7: growth using CO

A single crystal platinum substrate, the same as in Example 1, having (111) crystal surface was set in the reactor shown in FIG. 8. After the reaction chamber was evacuated, a hydrogen/carbon monoxide (CO) mixed gas with a CO concentration of 2.0% was introduced at 100 sccm, keeping the chamber pressure at 30 to 60 Torr. The diamond CVD was done in the same manner as in Example 1, although the substrate temperature was set at 900° to 930° C. After 3 hours, it was found that diamond particles were grown with an identical crystal orientation. After 15 hours under the same experimental conditions, adjacent diamond particles coalesced each other to form a single crystal diamond film with (111) crystal surface.

Example 8: growth using $CH_4$, $O_2$ and $H_2$

A growth experiment similar to Example 7 was undertaken using a single crystal Pt substrate with (001) crystal surface. The source gas was a mixture of 5% methane and 1% oxygen diluted with hydrogen. The gas flow rate was 100 sccm, the gas pressure was 30 to 60 Torr, and the substrate temperature was between 750° and 800° C. After 3 hours, diamond particles with the identical crystal orientation were grown. After 15 hours under the same experimental conditions, adjacent diamond particles coalesced each other to form a single crystal diamond film with (001) crystal surface.

Example 9: (001) growth by hot filament CVD

A single crystal platinum substrate, the same as in Example 2, with (001) crystal surface was set in the reactor shown in FIG. 8. The source gas was a mixture of 3% methane and 1% water vapor diluted by hydrogen. The gas flow rate was 100 sccm, and the gas pressure was 30 to 60 Torr. The hot filament was heated to 2200° C. The power to the substrate heater was controlled to keep the substrate temperature at 780° to 860° C. After 3 hours, diamond particles with an identical crystal orientation were grown. After 12 hours under the same experimental conditions, adjacent diamond particles coalesced each other to form a single crystal diamond film with (001) crystal surface.

Example 10: growth using ethanol

An experiment similar to Example 9 was done using 1% ethyl alcohol diluted by hydrogen as the source gas. The gas flow rate was 100 sccm, the chamber pressure was 50 Torr, and the substrate temperature was between 750° and 800° C. After 5 hours, diamond particles with an identical crystal orientation were grown. After 25 hours under the same experimental conditions, adjacent diamond particles coalesced each other to form a single crystal diamond film with (001) crystal surface.

Example 11: growth on off-axis substrates

A series of growth experiments was done in the same manner as in Example 2 using off-axis platinum substrates whose crystal surfaces were tilted from (001) toward the [011] direction by 2°, 4°, 6°, 8°, 10°, 12°, 14°, 16°, 18° and 20°. As a result, monocrystalline diamond films were obtained only when the off-axis angle was 10° or less. The diamond films were random polycrystalline when the tilt angles were 12° or above.

Example 12: growth on Pt (111) film

Platinum thin films of 0.03 mm thickness were deposited by magnetron or RF sputtering on single crystal strontium titanate ($SrTiO_3$) substrates with (111) crystal surface. During sputtering, the substrate temperature was maintained between 500° C. and 800° C. It was confirmed by X-ray diffraction and Reflection High Energy Electron Diffraction (RHEED) that the Pt films were (111) single crystals epitaxial to the strontium titanate substrate surface. The Pt-deposited strontium titanate substrates were used for diamond CVD in the same manner as in Example 1, and monocrystalline diamond films with (111) crystal surface resulted in an epitaxial relationship with the substrates.

In a series of experiments on Pt thin film sputter-deposition on strontium titanate, it was found that the Pt films were not single crystals when the substrate temperature was less than 500° C. during sputtering. However, the deposited Pt films became single crystals, if they were further annealed in air at a temperature higher than 800° C. (preferably higher than 1000° C.) for more than 10 hours. It was then found that monocrystalline diamond films can be grown by CVD on those substrates.

It should be noted that only polycrystalline diamond films were grown, if the thickness of the Pt film was less than 0.01 mm, presumably because of the fact that Pt became brittle after an exposure to the hydrogen plasma at high temperatures over a long period of time. In fact, Pt seemed to be degraded during diamond CVD before the substrate surface was covered with the diamond film, as the CVD was undertaken in hydrogen plasma as described in the above examples. It seemed that the single crystal nature of the Pt film is lost at the very early stage of diamond CVD, if the thickness of the Pt film is less than 1000 Å. Therefore, it was concluded that the thickness of the Pt thin film should be no less than 1000 Å.

Example 13: growth on Pt (001) film

Platinum thin film of 30 micron thickness was deposited by magnetron or RF sputtering on a single crystal strontium titanate (SrTiO$_3$) substrate with (001) crystal surface. The substrate temperature was maintained between 500° C. and 800° C. during sputtering. It was confirmed by X-ray diffraction and RHEED that the Pt film was a (001) single crystal epitaxial to the strontium titanate substrate surface. The Pt-deposited strontium titanate substrate was used for diamond CVD in the same manner as in Example 2, and a monocrystalline diamond film with (001) crystal surface resulted in an epitaxial relationship with the substrate.

Example 14: growth on Pt (111) film/MgO (111)

Platinum thin film of 30 micron thickness was deposited by magnetron or RF sputtering on a single crystal magnesium oxide (MgO) substrate with (111) crystal surface. The substrate temperature was maintained between 500° C. and 800° C. during sputtering. It was confirmed by X-ray diffraction and RHEED that the Pt film was a (111) single crystal epitaxial to the strontium titanate substrate surface. The Pt-deposited magnesium oxide substrate was used for diamond CVD in the same manner as in Example 1, and a monocrystalline diamond film with (111) crystal surface resulted in an epitaxial relationship with the substrate.

Example 15: growth on Pt (001) film/MgO (001)

Platinum thin film of 30 micron thickness was deposited by magnetron or RF sputtering on a single crystal magnesium oxide (MgO) substrate with (001) crystal surface. The substrate temperature was maintained between 500° C. and 800° C. during sputtering. It was confirmed by X-ray diffraction and RHEED that the Pt film was a (001) single crystal epitaxial to the strontium titanate substrate surface. The Pt-deposited magnesium oxide substrate was used for diamond CVD in the same manner as in Example 2, and a monocrystalline diamond film with (001) crystal surface resulted in an epitaxial relationship with the substrate.

Example 16: (111) growth on MgO (001)

Platinum thin film of 30 micron thickness was deposited by magnetron or RF sputtering on a single crystal magnesium oxide (MgO) substrate with (001) crystal surface. The substrate temperature was maintained between 300° C. and 400° C. during sputtering. It was confirmed by X-ray diffraction and RHEED that the Pt film was a (111) single crystal epitaxial to the strontium titanate substrate surface. The Pt-deposited magnesium oxide substrate was used for diamond CVD in the same manner as in Example 2, and a monocrystalline diamond film with (111) crystal surface resulted in an epitaxial relationship with the substrate.

Example 17: different supporting materials for Pt films

Experiments similar to Examples 12 to 16 were carried out using different support materials for Pt thin film deposition. The Pt thin films were characterized by X-ray diffraction and RHEED. Consequently, Pt films could be single crystals with (111) crystal surfaces when lithium fluoride, calcium fluoride, magnesium oxide, nickel oxide, zirconium oxide, sapphire (aluminum oxide), strontium titanate, barium titanate, lead titanate, potassium tantalate, lithium niobate, quartz and glass were used. Also, diamond films formed by CVD on such substrates were monocrystalline.

Example 18: annealing effect

Experiments similar to Examples 12 to 17 were carried out, where Pt films were annealed either during or after sputter deposition. The annealing temperature was changed in a range from 100° C. to 1500° C. at an interval of 100° C. It was found that after diamond CVD, monocrystalline diamond films were grown in a large area only when the Pt thin films had been annealed above 300° C.

Example 19: annealing atmosphere

The annealing of Example 18 was done in (1) inert gas, (2) hydrogen, (3) oxygen and hydrogen, (4) inert gas and oxygen, and (5) inert gas and hydrogen at 1000° C. for 20 hours. For the cases of (1), (3) and (5), domains of Pt markedly developed at Pt film surfaces, while for the cases of (2) and (5), the surfaces of Pt films were rough. Monocrystalline diamond films were grown only in the former cases. Thus, it was concluded that the Pt film annealing must be done in either inert gas or oxidation atmosphere, but not in reduction atmosphere.

Example 20: substrate pretreatment

In experiments similar to Examples 1 and 2, effect of substrate pretreatment on diamond film formation was investigated by leaving substrates in vacuum better than $10^{-6}$ Torr above 300° C. for more than 15 minutes prior to diamond CVD. It was found that the half-widths of X-ray diffraction rocking curves of the diamond films were 10 to 30% smaller than those of untreated diamond films obtained in Examples 1 and 2. Furthermore, the crystallinity of the diamond films on the pretreated substrates was better. In case that the vacuum level was worse than the above or the annealing time was shorter than 10 minutes, the crystal quality of the obtained films was similar to those obtained in Examples 1 and 2.

Example 21: gas treatment

In another experiment similar to Examples 1 and 2, the substrates were left in vacuum better than $10^{-6}$ Torr above 300° C. for more than 15 minutes, and diamond CVD was done using source gases that included at least one kind of gas selected from oxygen, chlorine and fluorine, or at least one inert gas selected from helium, neon and argon. The maximum concentration of the added gases was 1 vol %. As a result, the half-widths of the X-ray diffraction rocking curve of the diamond films were about 20% smaller than in the case of Example 20, and the film quality was better.

Example 22: scratching effects

Effects of substrate scratching on diamond film formation were studied in experiments similar to Example 1 using a single crystal of Pt with (111) crystal surface that had been buff and/or ultrasonically polished with diamond powder or paste before diamond CVD. As a result, it was found that the time required to achieve the same thickness of diamond film was shortened by 1 to 2 hours compared with the case of Example 1, but the film quality was identical. Thus, it was confirmed that the scratching of substrate surfaces leads to a reduction of growth time without a loss of crystallinity.

Example 23: BEN

Diamond films were synthesized by microwave plasma CVD using the apparatus shown in FIG. 10 under the conditions described below. The substrates used were single crystals of Pt (purity 99.99%, diameter: 10 mm, and thickness: 2 mm) with (111) or (001) crystal surfaces, and the substrate holder was made of molybdenum.

[Plasma treatment before biasing]
    Source gas: 0.1 to 10% of $CH_4$ diluted by $H_2$
    Gas flow rate: 50 to 300 sccm
    Gas pressure: 10 to 50 Torr
    Substrate temperature: 600° to 1100° C.
    Plasma treating time: 30 to 120 minutes

[During biasing]
    Source gas: 0.1 to 10% of $CH_4$ diluted by $H_2$
    Gas flow rate: 50 to 300 sccm
    Gas pressure: 1 to 100 Torr
    Substrate temperature: 400° to 1100° C.
    Applied electric bias: −70 to −350 Vdc or +70 to +350 Vdc
    Biasing time: 1 to 90 minutes

[Diamond growth after biasing]
    Source gas: 0.5 to 15% $CH_4$ and 0.1 to 7% $O_2$ diluted by $H_2$
    Gas flow rate: 50 to 300 sccm
    Gas pressure: 20 to 100 Torr
    Substrate temperature: 750° to 950° C.
    Growth time: 3 to 40 hours Consequently, monocrystalline diamond films with (111) and (001) crystal surfaces were grown on the Pt substrate with (111) and (001) crystal surfaces, respectively. The film thickness was about 10 to 50 microns. However, only randomly oriented polycrystalline diamond films were deposited when the biasing conditions were outside the above ranges.

Example 24: Growth without $H_2$

Experiments similar to Example 23 were carried out by microwave plasma CVD without using hydrogen gas. Diamond films were synthesized under the following conditions. The substrates used were the same as above.

[Plasma treatment before biasing]
    Source gas: $CO/CO_2$ mixture
    Gas flow rate: 50 to 300 sccm
    Gas pressure: 10 to 50 Torr
    Substrate temperature: 700° to 1200° C.
    Plasma treating time: 30 to 120 minutes

[During biasing]
    Source gas: $CO/CO_2$ mixture
    Gas flow rate: 50 to 300 sccm
    Gas pressure: 1 to 100 Torr
    Substrate temperature: 400° to 1100° C.
    Applied electric bias: −70 to −350 Vdc or +70 to +350 Vdc
    Biasing time: 1 to 90 minutes

[Diamond growth after biasing]
    Source gas: $CO/CO_2$ mixture
    Flow rate: 50 to 300 sccm
    Substrate temperature: 800° to 950° C.
    Gas pressure: 20 to 100 Torr
    Synthetic time: 3 to 40 hours Consequently, monocrystalline diamond films with (111) and (001) crystal surfaces were grown on the Pt substrate with (111) and (001) crystal surfaces, respectively. The film thickness was about 10 to 50 microns. However, only randomly oriented polycrystalline diamond films were deposited when the biasing conditions were outside the above ranges.

When the Pt film/strontium titanate substrates, the same as in Examples 12 and 13, were used instead of bulk Pt, monocrystalline diamond films were obtained irrespective of the Pt film thickness. However, when the Pt film/strontium titanate substrates were used under the conditions stated in Example 23, polycrystalline diamond films were grown if the Pt film thickness was less than 10 microns. Therefore, the Pt film thickness can be arbitrary, if hydrogen is not involved in the process of monocrystalline diamond film growth.

Example 25: Pt-Au alloy

Diamond growth was done by microwave plasma CVD according to Example 1 using Pt (80 atomic %)-Au (20 atomic %) alloy as a substrate (diameter: 10 mm, and thickness: 2 mm) that had been annealed at 1000° C. for 24 hours in vacuum. As a result, a monocrystalline diamond film with (111) crystal surface was obtained on the (111) crystal surface of the substrate.

Example 26: Pt-Ag alloy

An experiment similar to Example 25 was done using Pt (90 atomic %)-Ag (20 atomic %) alloy as a substrate. As a result, a monocrystalline diamond film with (111) crystal surface was obtained on the (111) crystal surface of the substrate.

Example 27: Pt-Cu alloy

An experiment similar to Example 25 was done using Pt (95 atomic %)-Cu (5 atomic %) alloy as a substrate. As a result, a monocrystalline diamond film with (111) crystal surface was obtained on the (111) crystal surface of the substrate.

Example 28: Pt-Pd alloy

An experiment similar to Example 25 was done using Pt (90 atomic %)-Pd (10 atomic %) alloy as a substrate. As a result, a monocrystalline diamond film with (111) crystal surface was obtained on the (111) crystal surface of the substrate.

Example 29: Pd-Ir alloy

An experiment similar to Example 25 was done using Pt (80 atomic %)-Ir (20 atomic %) alloy as a substrate. As a result, a monocrystalline diamond film with (111) crystal surface was obtained on the (111) crystal surface of the substrate.

Example 30: Pt-Mo alloy

An experiment similar to Example 25 was done using Pt (90 atomic %)-Cu (10 atomic %) alloy as a substrate. As a result, a monocrystalline diamond film with (111) crystal surface was obtained on the (111) crystal surface of the substrate.

Example 31: Pt-Cr alloy

An experiment similar to Example 25 was done using Pt (90 atomic %)-Cr (10 atomic %) alloy as a substrate. As a result, a monocrystalline diamond film with (111) crystal surface was obtained on the (111) crystal surface of the substrate.

Example 32: Pt-W alloy

An experiment similar to Example 25 was done using Pt (90 atomic %)-W (10 atomic %) alloy as a substrate. As a result, a monocrystalline diamond film with (111) crystal surface was obtained on the (111) crystal surface of the substrate.

Example 33: Pt-Ni alloy

An experiment similar to Example 25 was done using Pt (95 atomic %)-Ni (5 atomic %) alloy as a substrate. As a result, a monocrystalline diamond film with (111) crystal surface was obtained on the (111) crystal surface of the substrate.

Example 34: Pt-Fe alloy

An experiment similar to Example 25 was done using Pt (95 atomic %)-Fe (5 atomic %) alloy as a substrate. As a result, a monocrystalline diamond film with (111) crystal surface was obtained on the (111) crystal surface of the substrate.

Example 35: Pt-Co alloy

An experiment similar to Example 25 was done using Pt (95 atomic %)-Co (5 atomic %) alloy as a substrate. As a result, a monocrystalline diamond film with (111) crystal surface was obtained on the (111) crystal surface of the substrate.

Example 36: Pt-Mn alloy

An experiment similar to Example 25 was done using Pt (95 atomic %)-Mn (5 atomic %) alloy as a substrate. As a result, a monocrystalline diamond film with (111) crystal surface was obtained on the (111) crystal surface of the substrate.

As will be apparent from the foregoing examples, monocrystalline diamond films with practically large areas can be formed on substrates made of bulk Pt or its alloys that possess (111) or (001) crystal surfaces, or thin films of Pt or its alloys that possess (111) or (001) crystal surfaces, if the proper experimental procedure is used according to the present invention and embodiment.

What is claimed is:

1. A method for forming monocrystalline diamond films by chemical vapor deposition (CVD) on substrates which are made of platinum or its alloys and have either (111) or (001) crystal surfaces and/or inclined crystal surfaces with angular deviations within ±10 degrees from (111) or (001), respectively, on the substrate surfaces entirely or at least partly.

2. A method for forming monocrystalline diamond films by CVD on substrates each of which comprises of a film of platinum or its alloys deposited on the entire or at least part of the supporting material surface, where the film has either (111) or (001) crystal surfaces and/or inclined crystal surfaces with angular deviations within ±10 degrees from (111) or (001), respectively.

3. A method for forming monocrystalline diamond films according to claim 2, wherein the thicknesses of the said films of Pt or Pt alloys are more than about 1000 Å and less than about 0.5 mm.

4. A method for forming monocrystalline diamond films according to claim 2, wherein the minority components of the said Pt alloys comprise of single or plural elements selected from the group of the VIA elements, the VIIIA elements, and the IB elements, and the total concentration of the minority components is not greater than 50 atomic %.

5. A method for forming monocrystalline diamond films according to claim 1, wherein the surface of said substrate consists of domains of said crystal surface, whereby monocrystalline diamond films with (111) or (001) crystal surfaces grow on the corresponding domains of the substrate.

6. A method for forming monocrystalline diamond films according to claim 2, wherein said supporting material is made of a single crystal of at least one member selected from the group consisting of lithium fluoride, calcium fluoride, magnesium oxide, nickel oxide, zirconium oxide, aluminum oxide, strontium titanate, barium titanate, lead titanate, potassium tantalate and lithium niobate.

7. A method for forming monocrystalline diamond films according to claim 2, wherein said supporting material is made of single crystal silicon, quartz or glass.

8. A method for forming monocrystalline diamond films according to claim 2, wherein said film is annealed at a temperature not lower than 300° C. during and/or after the deposition.

9. A method for forming monocrystalline diamond films according to claim 8, wherein said film is annealed in an oxidation atmosphere.

10. A method for forming monocrystalline diamond films according to claim 1, wherein the surfaces of said substrates have been buff and/or ultrasonically polished with diamond powder or paste prior to diamond CVD.

11. A method for forming monocrystalline diamond films according to claim 1, wherein the surfaces of said substrates have been ion-implanted with carbon using the conditions that the acceleration voltage is between 40 and 120 keV and the carbon implantation density is between $10^{16}$–$10^{20}$ cm$^{-2}$.

12. A method for forming monocrystalline diamond films according to claim 1, wherein prior to diamond CVD, said substrate is treated in a vacuum better than $10^{-6}$ Torr above 300° C. for more than 15 minutes, and then cleaned in a plasma which comprises at least one gas selected from the group consisting of hydrogen, oxygen, chlorine and fluorine, or at least one inert gas selected from the group consisting of helium neon and argon, or a mixture of both.

13. A method for forming monocrystalline diamond films according to claim 12, wherein after cleaning said substrate the surface of said substrate is treated by a plasma which comprises a carbon-containing gas and, optionally, at least one gas selected from the group consisting of hydrogen, oxygen, chlorine and fluorine, and at least one inert gas selected from the group consisting of helium neon and argon, or a mixture of both.

14. A method for forming monocrystalline diamond films according to claim 1, wherein said substrate is applied with a bias voltage in a plasma of carbon-containing gas.

15. A method for forming monocrystalline diamond films according to claim 14, wherein the reaction gas is free of hydrogen atoms.

16. A method for forming monocrystalline diamond films according to claim 14, wherein the nuclei are formed from a carbon-containing gas diluted by hydrogen to a concentration of 0.1 to 10 vol % under the conditions that the gas pressure is 1 to 100 Torr, the substrate temperature is 400° to 1100° C., the DC voltage is −70 to −30 V or +70 to +350 V and the biasing time is 1 to 90 minutes.

17. A method for forming monocrystalline diamond films according to claim 1, wherein diamond CVD is undertaken using a source gas which is free of hydrogen atoms.

18. A method for forming monocrystalline diamond films according to claim 1, wherein diamond CVD is done using a mixture of methane, oxygen and hydrogen, where the methane concentration is between 0.1 and 5%, and the oxygen concentration is between 0.1 and 3%, at a substrate temperature higher than 750° C., whereby a monocrystalline diamond film with (111) crystal surface is deposited on the (111) crystal surface of said substrate.

19. A method for forming monocrystalline diamond films according to claim 1, wherein diamond CVD is done using a mixture of methane, oxygen and hydrogen, where the methane concentration is between 5 and 15%, and the oxygen concentration is between 1 and 7%, at a substrate temperature lower than 850° C., whereby a monocrystalline diamond film with (001) crystal surface is deposited on the (001) crystal surface of said substrate.

20. A method for forming monocrystalline diamond films according to claim 2, wherein the surface of said substrate consists of domains of said crystal surface, whereby monocrystalline diamond films with (111) or (001) crystal surfaces grow on the corresponding domains of the substrate.

21. A method for forming monocrystalline diamond films according to claim 2, wherein the surfaces of said substrates have been buff and/or ultrasonically polished with diamond powder or paste prior to diamond CVD.

22. A method for forming monocrystalline diamond films according to claim 2, wherein the surfaces of said substrates have been ion-implanted with carbon using the conditions that the acceleration voltage is between 40 and 120 keV and the carbon implantation density is between $10^{16}$–$10^{20}$ $cm^{-2}$.

23. A method for forming monocrystalline diamond films according to claim 2, wherein prior to diamond CVD, said substrate is treated in a vacuum better than $10^{-6}$ Torr above 300° C. for more than 15 minutes, and then cleaned in a plasma which comprises at least one gas selected from the group consisting of hydrogen, oxygen, chlorine and fluorine, or at least one inert gas selected from the group consisting of helium, neon and argon, or a mixture of both.

24. A method for forming monocrystalline diamond films according to claim 23, wherein after cleaning said substrate the surface of said substrate is treated by a plasma which comprises a carbon-containing gas and, optionally, at least one gas selected from the group consisting of hydrogen, oxygen, chlorine and fluorine, and at least one inert gas selected from the group consisting of helium, neon and argon, or a mixture of both.

25. A method for forming monocrystalline diamond films according to claim 2, wherein said substrate is applied with a bias voltage in a plasma of carbon-containing gas.

26. A method for forming monocrystalline diamond films according to claim 25, wherein the reaction gas is free of hydrogen atoms.

27. A method for forming monocrystalline diamond films according to claim 25, wherein the nuclei are formed from a carbon-containing gas diluted by hydrogen to a concentration of 0.1 to 10 vol % under the conditions that the gas pressure is 1 to 100 Torr, the substrate temperature is 400° to 1100° C., the DC voltage is −70 to −30 V or +70 to +350 V and the biasing time is 1 to 90 minutes.

28. A method for forming monocrystalline diamond films according to claim 2, wherein diamond CVD is undertaken using a source gas which is free of hydrogen atoms.

29. A method for forming monocrystalline diamond films according to claim 2, wherein diamond CVD is done using a mixture of methane, oxygen and hydrogen, where the methane concentration is between 0.1 and 5%, and the oxygen concentration is between 0.1 and 3%, at a substrate temperature higher than 750° C., whereby a monocrystalline diamond film with (111) crystal surface is deposited on the (111) crystal surface of said substrate.

30. A method for forming monocrystalline diamond films according to claim 2, wherein diamond CVD is done using a mixture of methane, oxygen and hydrogen, where the methane concentration is between 5 and 15%, and the oxygen concentration is between 1 and 7%, at a substrate temperature lower than 850° C., whereby a monocrystalline diamond film with (001) crystal surface is deposited on the (001) crystal surface of said substrate.

* * * * *